(12) United States Patent
Kobayashi et al.

(10) Patent No.: US 7,048,493 B2
(45) Date of Patent: May 23, 2006

(54) METHOD OF MANUFACTURING A SEMICONDUCTOR INTEGRATED CIRCUIT DEVICE WHICH PREVENTS FOREIGN PARTICLES FROM BEING DRAWN INTO A SEMICONDUCTOR CONTAINER CONTAINING SEMICONDUCTOR WAFERS

(75) Inventors: Yoshiaki Kobayashi, Hitachinaka (JP); Shigeru Kobayashi, Hiratsuka (JP); Kenji Tokunaga, Hachioji (JP); Koji Kato, Matsudo (JP); Teruo Minami, Tokyo (JP)

(73) Assignees: Hitachi Plant Engineering & Construction Co. LTD, Tokyo (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 10/974,819

(22) Filed: Oct. 28, 2004

(65) Prior Publication Data

US 2005/0111937 A1    May 26, 2005

Related U.S. Application Data

(63) Continuation of application No. 10/031,785, filed as application No. PCT/JP00/05012 on Jul. 27, 2000, now abandoned.

(30) Foreign Application Priority Data

Jul. 27, 1999   (JP) ................................ 11-211724

(51) Int. Cl.
*H01L 21/69* (2006.01)
(52) U.S. Cl. .................... 414/810; 414/217.1
(58) Field of Classification Search ............... 414/217, 414/222.02, 217.1, 925, 806, 810, 940
See application file for complete search history.

(56) References Cited

U.S. PATENT DOCUMENTS

| | | | |
|---|---|---|---|
| 6,082,951 A | 7/2000 | Nering et al. | |
| 6,161,575 A | 12/2000 | Tseng et al. | |
| 6,183,358 B1 | 2/2001 | Adair, Jr. | |
| 6,220,808 B1 | 4/2001 | Bonora et al. | |
| 6,224,679 B1 | 5/2001 | Sasaki et al. | |
| 6,281,516 B1 | 8/2001 | Bacchi et al. | |
| 6,491,832 B1 | 12/2002 | Yoshioka et al. | |
| 6,553,332 B1 | 4/2003 | Leng | |

OTHER PUBLICATIONS

Y. Kobayashi, et al., Particle Characteristics of 300-mm Minienvironment (FOUP and LPU), IEEE Transactions on Semiconductor Manufacturing, vol. 13, No. 3, Aug. 2000.

*Primary Examiner*—Eileen D. Lillis
*Assistant Examiner*—Charles A. Fox
(74) *Attorney, Agent, or Firm*—Antonelli, Terry, Stout and Kraus, LLP.

(57) ABSTRACT

When a conventional semiconductor container opening/closing apparatus opens a lid of a semiconductor container, foreign particles enter into the container from outside through a gap between the container and a wall surface of the container opening/closing apparatus and adhere to a wafer in the container. A method is provided to reduce the number of foreign particles adhering to the wafer by preventing foreign particles from entering into the container at the time of opening the container by the opening/closing apparatus. To achieve this, a velocity-differential pressure ratio obtained by dividing the maximum velocity at the time of opening the lid of the container in a vertical direction to an opening of the container, by the differential pressure between the inside pressure and the outside pressure of said semiconductor manufacturing apparatus, is set to be 0.06 ((m/s) Pa) or less.

3 Claims, 8 Drawing Sheets

METHOD OF MANUFACTURING A SEMICONDUCTOR INTEGRATED CIRCUIT DEVICE WHICH PREVENTS FOREIGN PARTICLES FROM BEING DRAWN INTO A SEMICONDUCTOR CONTAINER CONTAINING SEMICONDUCTOR WAFERS

CROSS-REFERENCE TO RELATED APPLICATIONS

This is application is a Continuation of application Ser. No. 10/031,785, filed Jan. 25, 2002, now abandoned and wherein application Ser. No. 10/031,785 is a national stage application filed under 35 USC § 371 of International Application No. PCT/JP00/05012, filed Jul. 27, 2000. The contents of application Ser. No. 09/380,735 is incorporated herein by reference in their entirety.

TECHNICAL FIELD OF THE INVENTION

The present invent ion relates to a semiconductor container opening/closing apparatus, which opens and closes a lid of a semiconductor wafer container used in a semiconductor manufacturing process, and more particularly relates to a semiconductor device manufacturing method in which the semiconductor container opening/closing apparatus is installed in each semiconductor manufacturing apparatus and a semiconductor wafer is conveyed using the semiconductor wafer container.

BACKGROUND OF THE INVENTION

Recently, in semiconductor manufacturing plants, semiconductor wafers are conveyed between each manufacturing apparatus while being stored in semiconductor containers (hereinafter, referred to as a container) with a lid that isolates the semiconductor wafers from the outer environment. The inside of the container is kept in a very clean condition in comparison to the outside and only a small number of foreign particles are adhered to the wafer inside the container if the lid of the container is not opened. The condition outside the container is the ISO cleanliness level 6 or the like, and if the wafer is left in such a condition, over time the foreign particles are adhered to a surface of the wafer. Consequently, the yield of a semiconductor component formed on the wafer is significantly decreased. The container opening/closing apparatus is provided in each manufacturing apparatus, and the inside of the manufacturing apparatus is kept in a very clean condition in comparison to the outside, that is, the ISO cleanliness level 1 to 2.

When the wafer is conveyed from the container to the manufacturing apparatus or from the manufacturing apparatus to the container, the manufacturing apparatus and the container are first connected to each other via the container opening/closing apparatus. Next, the lid of the container is opened, and thereby it is possible to directly connect the clean area inside the manufacturing apparatus and the clean area inside the container. Therefore, there is little possibility that the wafer is exposed to the outside air.

The velocity of opening the lid of the container in the conventional container opening/closing apparatus is set high in order to reduce the operating time. Also, the conventional container opening/closing apparatus is provided with a safety cover that covers a driving system in the rear side of the apparatus. As a result, the lower end portion of this safety cover has a closed structure.

Conventional container opening/closing apparatuses have suffered from the following problem. That is, since the velocity of opening the lid of the container is high, the inside of the container is under negative pressure at the time of opening the lid of the container. As a result, foreign particles outside the container enter the container through the gap between the container and the container opening/closing apparatus, and the foreign particles adhere to the wafer.

In addition, another problem also exists in the conventional container opening/closing apparatus. That is, since a safety cover is provided for the conventional container opening/closing apparatus to cover the driving system in the rear side thereof, and since the lower end portion of the safety cover has a closed structure, foreign particles are deposited inside the safety cover. These foreign particles are blown out when a lid elevator unit moves downward, and then enter the container to adhere to the wafer.

An object of the present invention is to reduce the number of foreign particles adhering to a wafer by preventing the foreign particles from entering the container at the time of opening the container using the container opening/closing apparatus.

Also, another object of the present invention is to reduce the number of foreign particles adhering to a wafer by preventing the foreign particles from being deposited inside the safety cover and preventing the foreign particles from being blown out.

DISCLOSURE OF THE INVENTION

For the achievement of the above objects, the semiconductor container opening/closing apparatus and a method of opening and closing a lid of the semiconductor wafer container according to the present invention are characterized in that a velocity-differential pressure ratio obtained by dividing the maximum velocity (m/s) at the time of opening the semiconductor container, by the differential pressure (Pa) between the inside pressure and the outside pressure of the semiconductor manufacturing apparatus, is set to be 0.006 ((m/s)/Pa) or less.

Also, the semiconductor container opening/closing apparatus according to the present invention is characterized in that an opening is provided at a lower end portion of the cover in the rear side of the semiconductor container opening/closing apparatus.

Also, the semiconductor container opening/closing apparatus according to the present invention is characterized in that an exhaust fan is provided at a lower end portion of the cover in the rear side of the semiconductor container opening/closing apparatus.

DESCRIPTION OF THE PREFERRED EMBODIMENTS

For a more detailed description of a first embodiment of the present invention, the first embodiment will be described based on the accompanying drawings (FIGS. * 1 to 8).

Figure 1:
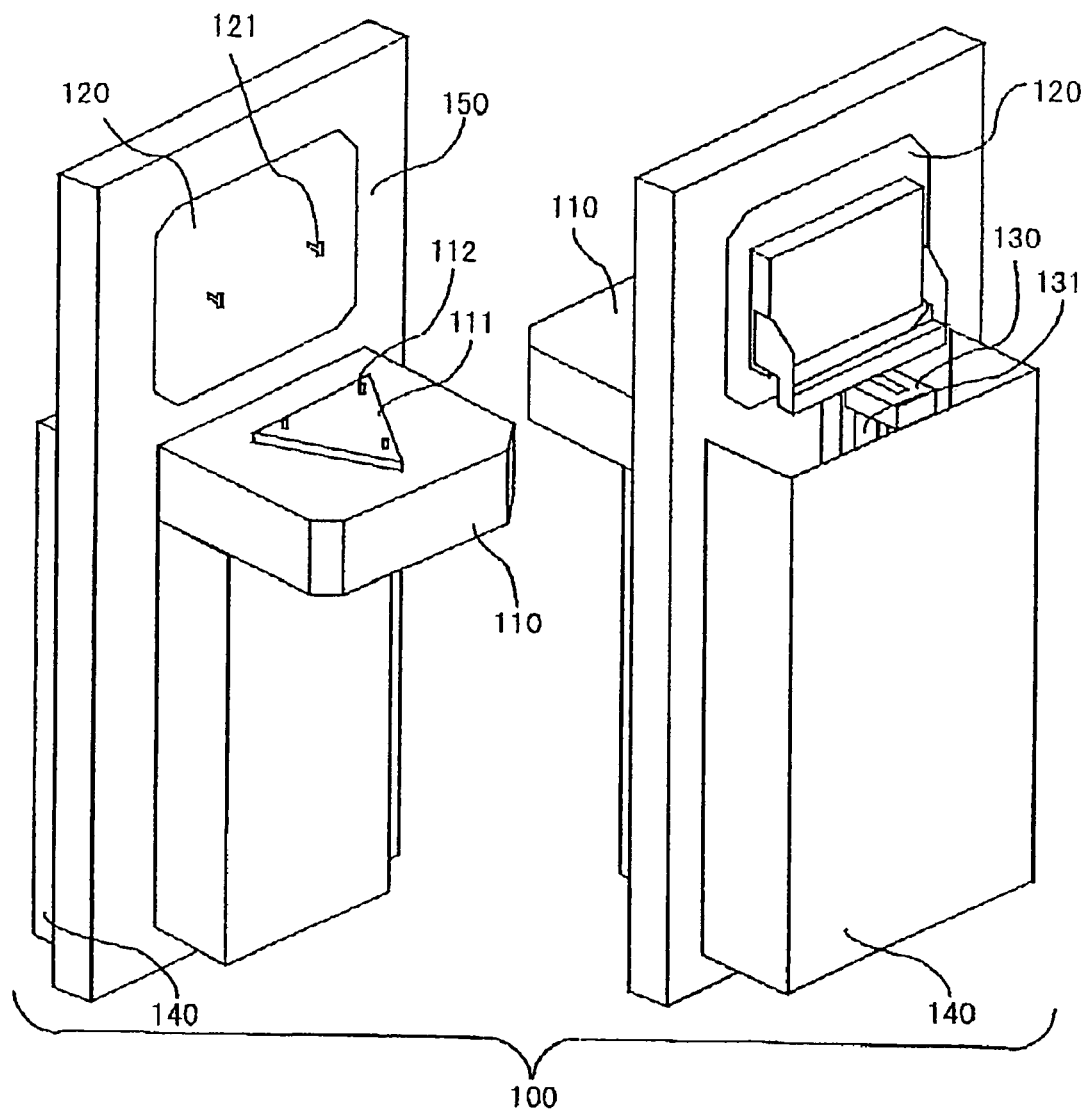
FIG. 1 is a perspective view of a semiconductor container opening/closing apparatus according to a first embodiment of the present invention.
Figure 2:
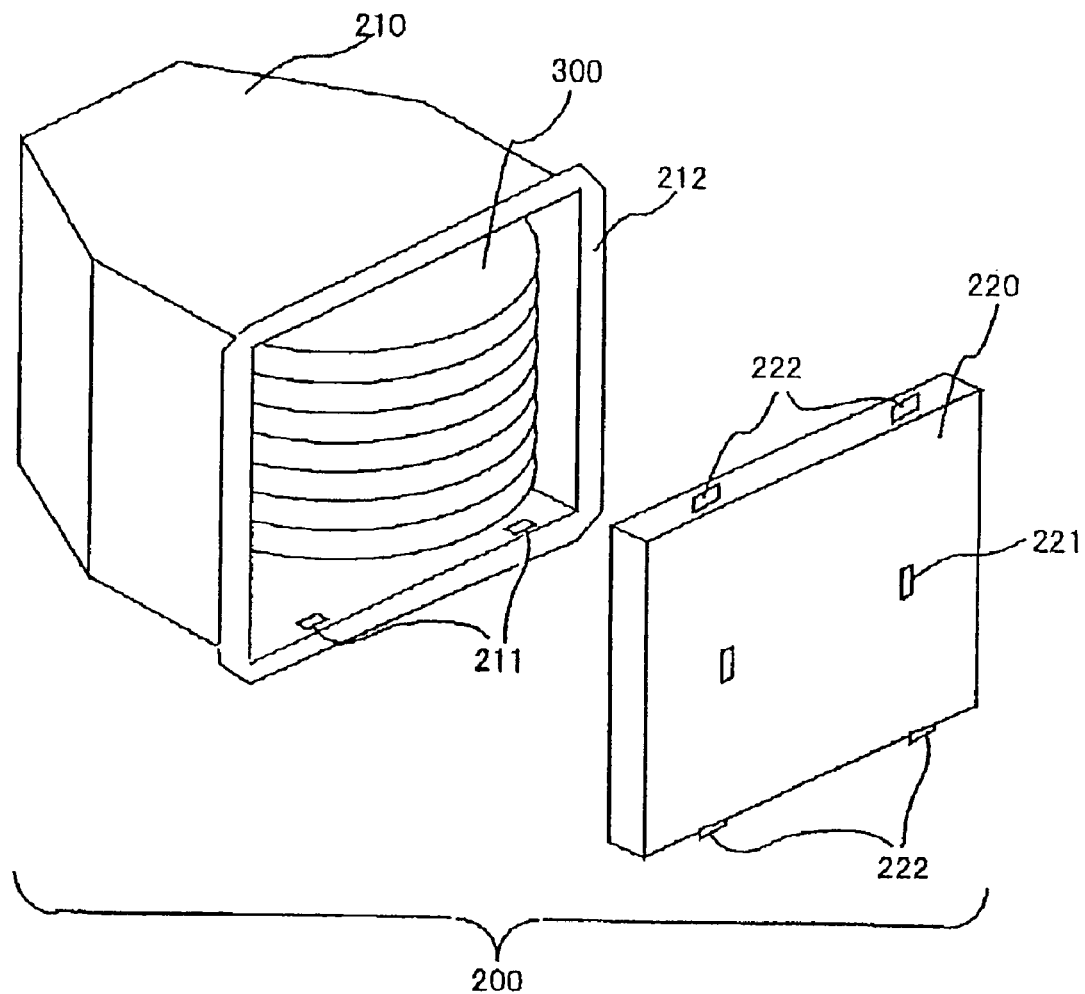
FIG. 2 is a perspective view of a semiconductor container.
Figure 3:
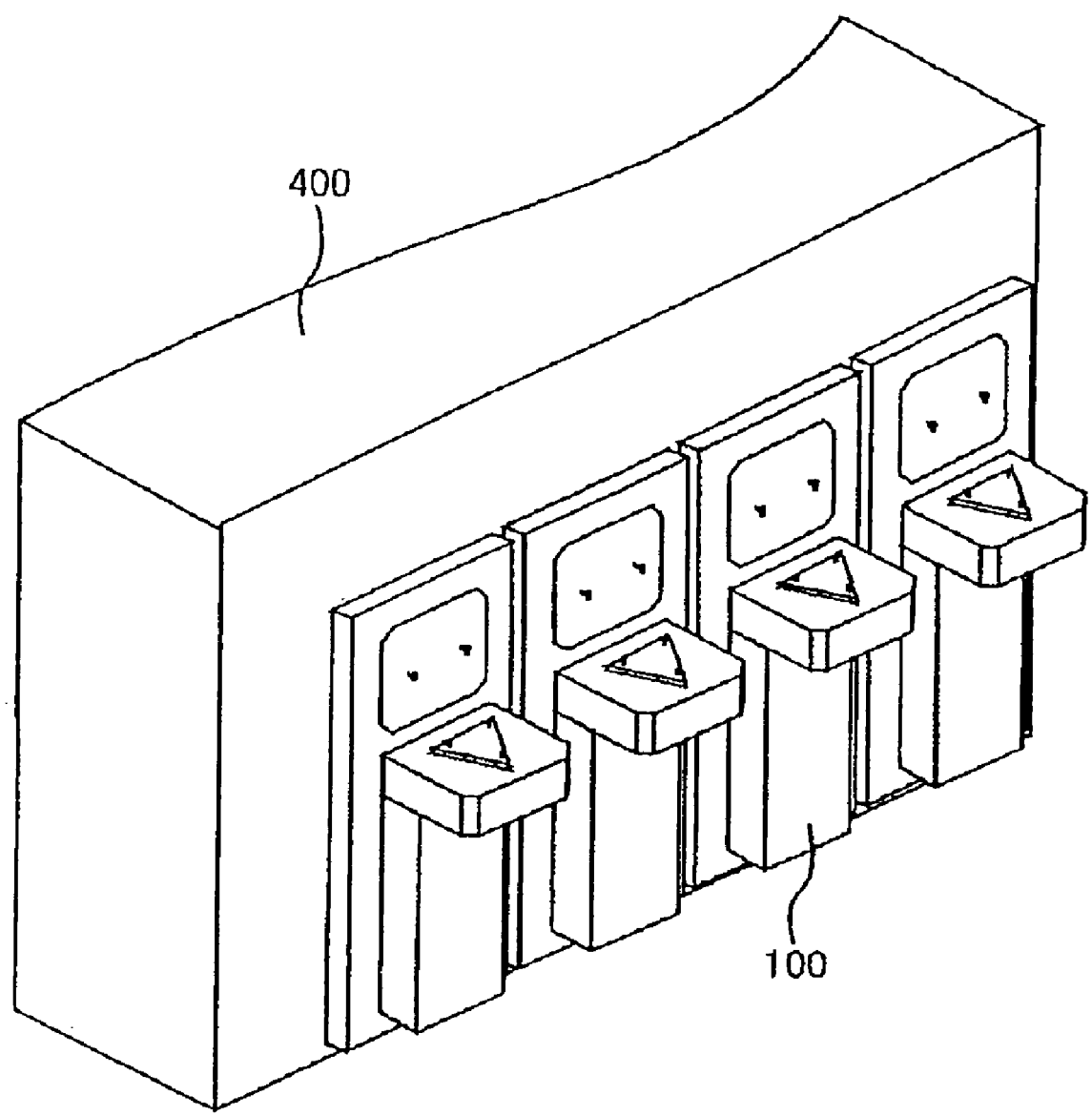
FIG. 3 is a perspective view of a semiconductor manufacturing apparatus in which semiconductor container opening/closing apparatuses according to a first embodiment of the present invention are installed.
Figure 4:
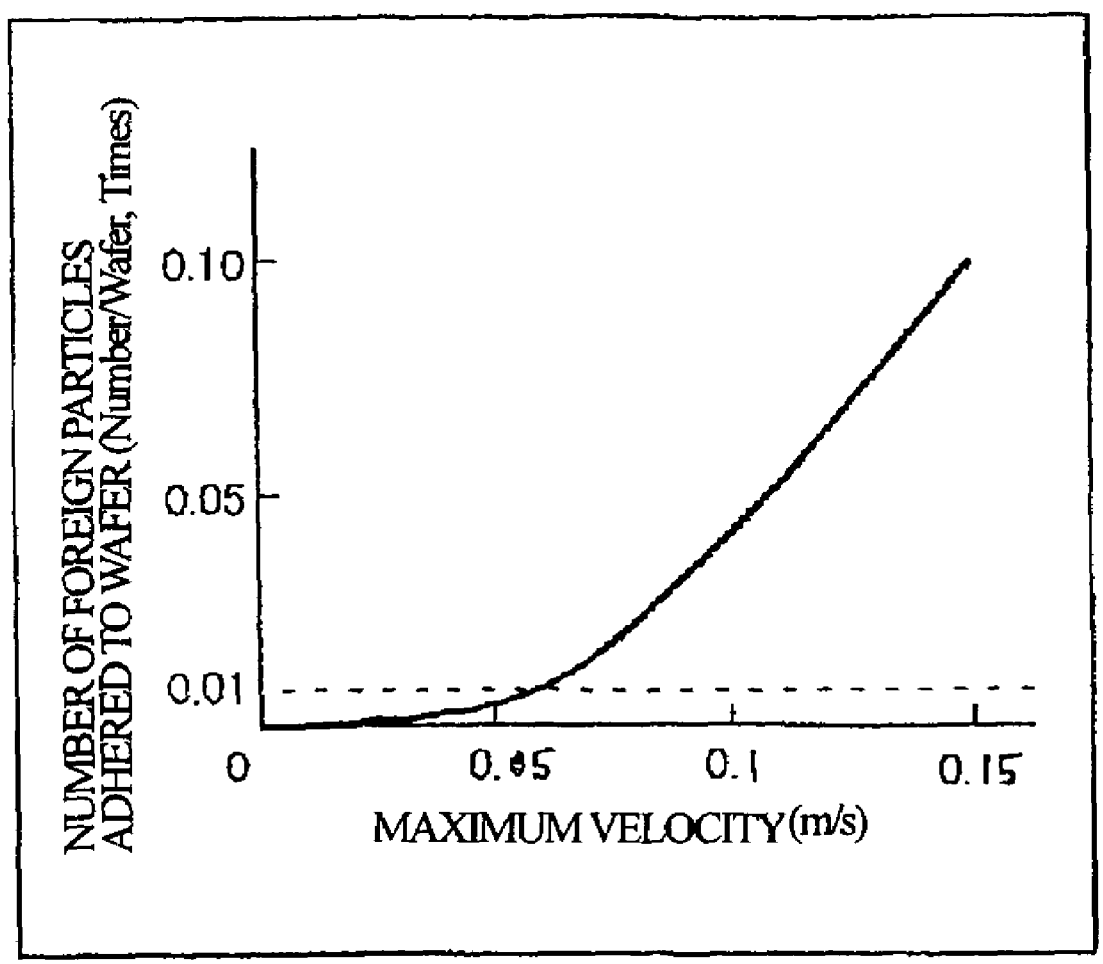
FIG. 4 is a conceptual graph showing the correlation between the maximum velocity of opening the semiconductor container and the number of foreign particles adhering to a wafer.
Figure 5:
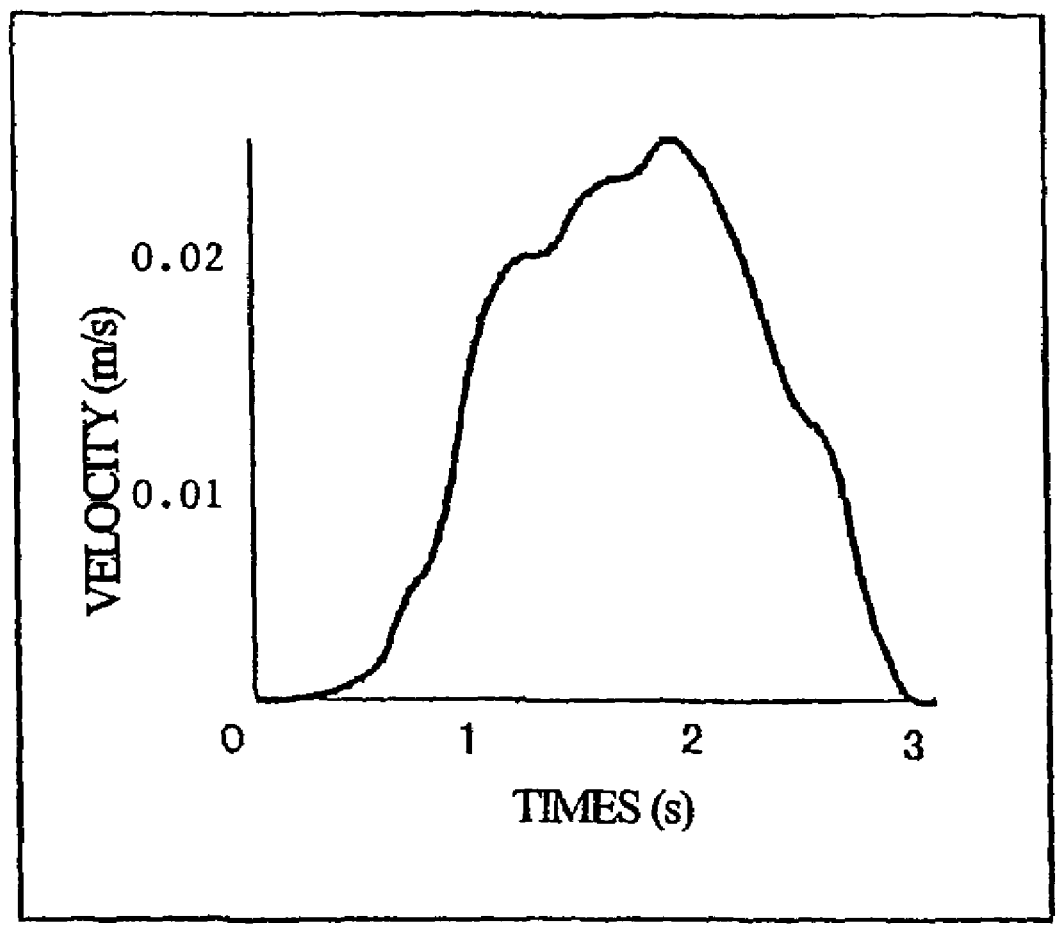
FIG. 5 is a conceptual view showing, relative to change of time, the velocity of opening the container by the semiconductor container opening/closing apparatus according to a first embodiment of the present invention.
Figure 6:
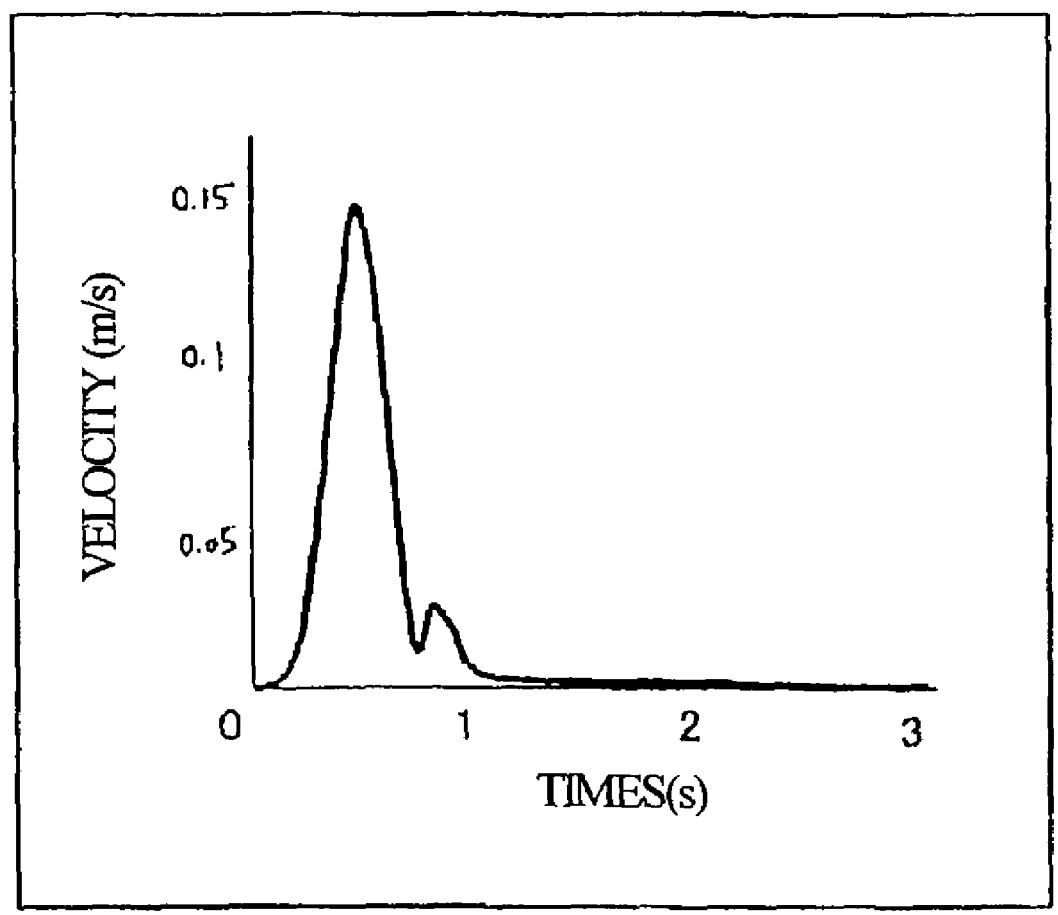
FIG. 6 is a conceptual graph showing, relative to change of time, the velocity of opening the container by the conventional semiconductor container opening/closing apparatus.
Figure 7:
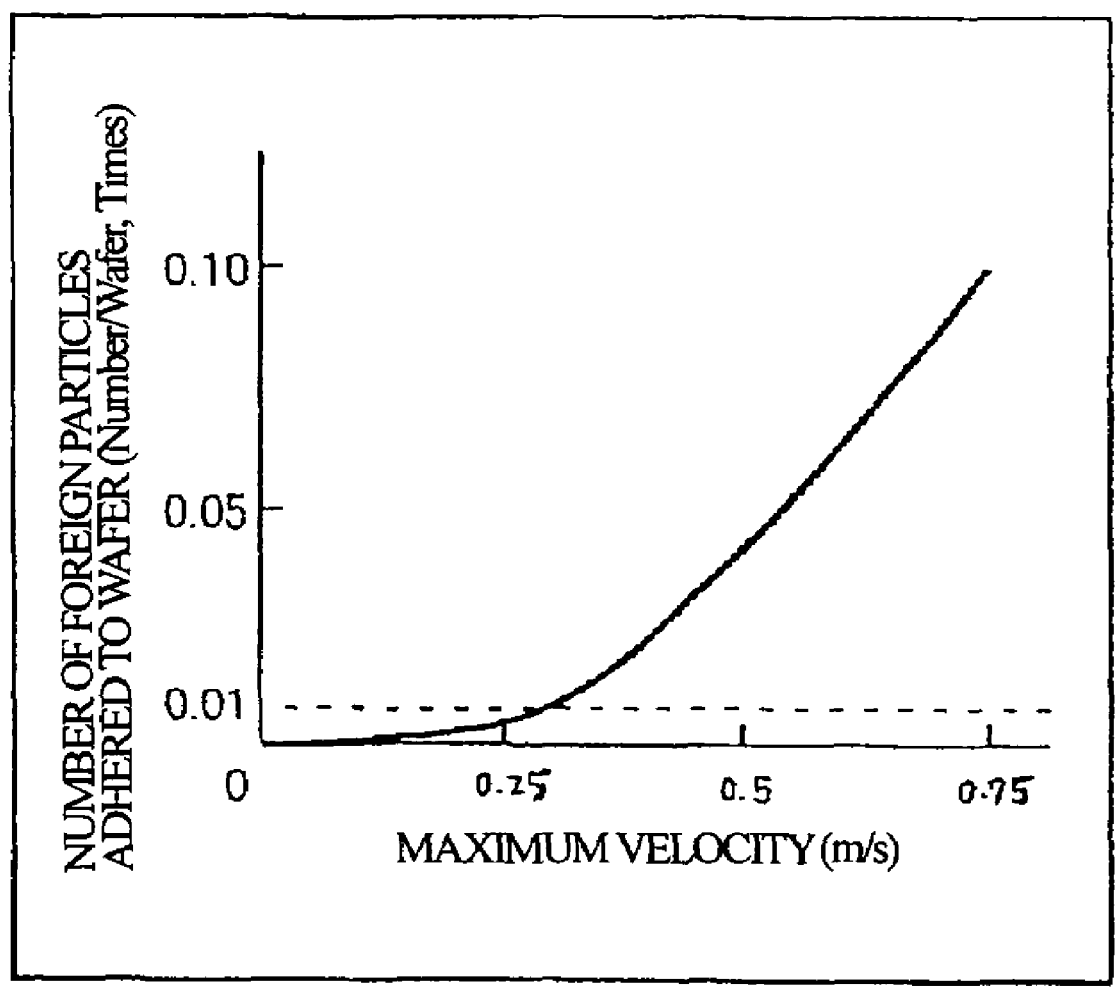
FIG. 7 is a conceptual graph showing the correlation between the maximum velocity of opening the semiconductor container and the number of foreign particles adhering to a wafer.
Figure 8:
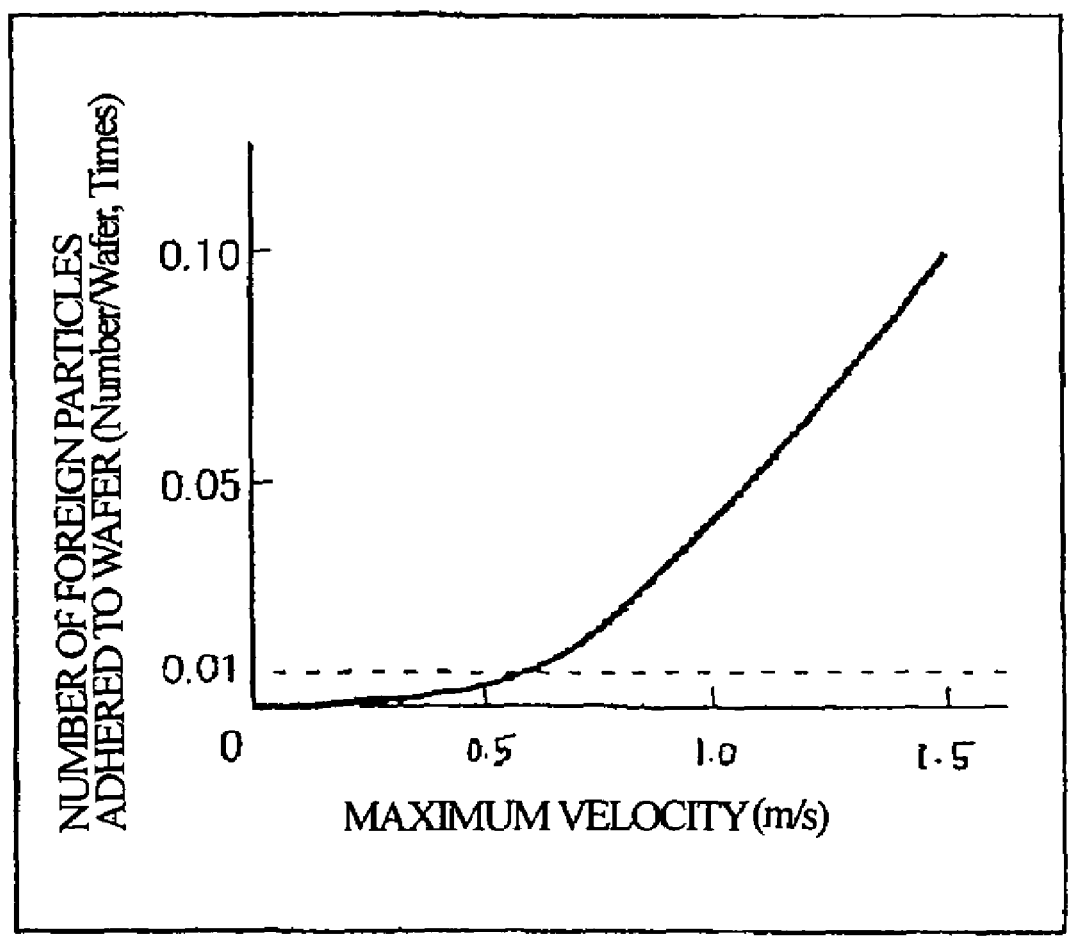
FIG. 8 is a conceptual graph showing the correlation between the maximum velocity of opening the semiconductor container and the number of foreign particles adhering to the wafer.

FIG. 1 is a perspective view of a semiconductor container opening/closing apparatus (hereinafter, referred to as an opening/closing apparatus) according to the first embodiment of the present invention, FIG. 2 is a perspective view of a semiconductor container (hereinafter, referred to as a container), FIG. 3 is a perspective view of a semiconductor manufacturing apparatus (hereinafter, referred to as a manufacturing apparatus) in which the opening/closing apparatuses are installed, FIGS. 4, 7, and 8 are conceptual graphs each showing the correlation between the maximum velocity of opening the container and the number of foreign particles adhering to a wafer, FIG. 5 is a conceptual graph showing, relative to change of time, the velocity of opening the container by the opening/closing apparatus according to the first embodiment of the present invention, and FIG. 6 is a conceptual graph showing, relative to a change of time, the velocity of opening the container by the conventional opening/closing apparatus.

Descriptions will be first made of respective structures of an opening/closing apparatus 100 and a container 200 by using FIGS. 1 and 2. The opening/closing apparatus 100 is mainly constituted by a stage 110 for placing the container 200, and an opener 120 for holding a lid 220 of the container 200 and for opening and closing the lid 220. The stage 110 is provided with positioning pins 112 for placing the container 200 in a proper position, and a slider ill for bringing the container 200 closer to an opener 120. In this embodiment, the slider 111 is movable back and forth by a motor and a ball screw (not shown) provided in the stage 110. Rotating keys 121 are provided on the opener 120, and the rotating keys 121 can rotate up to 90 degrees by a motor (not shown) provided in the opener 120. In the rear side of the opener 120, an opener opening/closing mechanism 130 for opening and closing the lid 220 of the container 200 by making the opener 120 move back and forth horizontally, and an opener elevator mechanism 131 for moving the opener 120 up and down are provided. Both of the opener opening/closing mechanism 130 and the opener elevator mechanism 131 are operated by a motor and a ball screw (not shown), and a safety cover 140 is provided on the whole of both driving units of the opener opening/closing mechanism 130 and the opener elevator mechanism 131 so that an operator(s) can not touch them easily.

The container 200 is constituted by a container body 210 and the lid 220. The container body 210 is provided with four latch grooves 211, and a flange 212 is provided around the container body 210. A shelf (not shown) is provided inside the container body 210 for storing wafers 300 horizontally, and twenty-five wafers can be stored therein. Key grooves 221 are provided on the lid 220 at positions corresponding to those of the rotating keys 121 of the opening/closing apparatus 100. The rotating keys 121 of the opening/closing apparatus 100 are inserted into the key grooves 221 and rotated by 90 degrees. By virtue of this, four latches 222 in the lid 220 come in and out from the lid 220 by a cam mechanism (not shown) operating* inside the lid 220. The latches 222 are at positions corresponding to those of the latch grooves 211 of the container body 210, and when the latches 222 come out from the periphery of the lid 220 while the lid 220 is inserted in the container body 210, the lid 220 can be fixed to the container body 210.

The actual operation of opening the container 200 is carried out as follows. The container 200 is placed on the stage 110. The slider 111 on the stage 110 is moved horizontally toward the manufacturing apparatus, and a surface of the lid 220 of the container 200 and the opener 120 of the opening/closing apparatus 100 are contacted to each other. At this time, though the flange 212 of the container 200 and a surface board 150 of the opening/closing apparatus 100 are partly contacted to each other, a gap is inevitably left therebetween due to the process accuracy of the container 200. When the rotating keys 121 are rotated by 90 degrees in the clockwise direction toward the container 200 while the lid 220 and the opener 120 are contacted to each other, the key grooves 221 of the lid 220 are rotated and the lid 220 is fixed to the opener 120. Simultaneously, the latches 222 are accommodated inside the lid 220 by a function of the cam mechanism (not shown) inside the lid 220. Thereafter, the opener opening/closing mechanism 130 is horizontally moved toward the manufacturing apparatus to detach the lid 220 of the container 200 from the container body 210. Specifically, the lid 220 of the semiconductor container 200 is held and opened in a direction vertical to an opening surface of the container 200. Then, the opener 120 is moved downward by the opener elevator mechanism 131.

The operation of closing the container 200 is carried out in a reverse manner to the operation of opening the same, in which, after the opener elevator mechanism 131 is moved upward, the opener opening/closing mechanism 130 is moved horizontally toward the stage 110 to connect, to the container body 210, the lid 220 fixed to the opener 120. Thereafter, when the rotating keys 121 are rotated by 90 degrees in the counterclockwise direction, the latches 222 of the lid 220 are fit into the latch grooves 211 on the container body 210. Thus, the lid 220 is fixed to the container body 210. Finally, the slider 111 is moved horizontally in a direction opposite to the manufacturing apparatus, and, thereby, the container 200 is put into a state where it can be detached from the stage 110.

FIG. 3 shows an example where four opening/closing apparatuses 100 are mounted to a manufacturing apparatus 400. Downflow is formed inside the manufacturing apparatus 400, and the inside of the apparatus 400 is kept in the ISO cleanliness level 1 to 2, that is, the inside thereof is kept in a very clean condition in comparison to the outside of the manufacturing apparatus 400 which is in the ISO cleanliness level 6. If a wafer is left in the environment of the ISO cleanliness level 6, over time foreign particles adhere to a wafer surface. As a result, the yield of semiconductor components formed on the wafer is significantly decreased. The inside of the container 200 is shielded from the outside thereof, and if the wafer 300 is loaded and unloaded in the high-cleanliness environment, the cleanliness inside the container is maintained. Therefore, even if the container 200 is left in the environment of the ISO cleanliness level 6, only a small number of foreign particles adhere to the wafer 300 inside the container 200 unless the lid 220 of the container 200 is opened or closed.

When the wafer 300 is moved from the container 200 to the manufacturing apparatus 400 or from the manufacturing apparatus 400 to the container 200, the lid 220 of the container 200 is opened or closed after connection of the manufacturing apparatus 400 and the container 200 via the container opening/closing apparatus 100. Thus, a clean area inside the manufacturing apparatus 400 and a clean area inside the container 200 are directly connected to each other. Since the pressure inside the manufacturing apparatus 400 is set to a slightly positive pressure in comparison to the outside thereof, there is little possibility that the foreign particles will flow through the gap between the flange 211 of the container 200 and the surface board 150 of the opening/closing apparatus 100, except at the moment of opening or closing the container 200.

If the operating velocity of the opener opening/closing mechanism 130 of the opening/closing apparatus 100 is high, then the inside of the container 200 experiences a negative pressure at the time of pulling out the lid 220 from the container body 210, and the foreign particles enter into the container 200 through the gap between the flange 211 of the container 200 and the surface board 150 of the opening/closing apparatus 100, and adhere to the wafer 300.

FIG. 5 shows, relative to the change with time, the velocity of opening the container 200 by the opener opening/closing mechanism 130 of the opening/closing apparatus 100 according to the present invention. In FIG. 5, the horizontal axis represents time (s) and the vertical axis represents the velocity of opening (m/s), and the maximum velocity is 0.025 (m/s). FIG. 6 shows, relative to the change with time, the velocity of opening the container 200 by the opener opening/closing mechanism 130 of the conventional opening/closing apparatus 100. In FIG. 6, the horizontal axis represents time (s) and the vertical axis represents the velocity of opening (m/s), and the maximum velocity is 0.15 (m/s).

FIG. 4 is a conceptual graph showing the correlation between the maximum velocity of opening the container and the number of foreign particles adhering to a wafer stored •in the container when the inside pressure of the apparatus 400 is higher by 1 (Pa) than the pressure of the outside. In FIG. 4, the horizontal axis represents the maximum velocity (m/s) of opening the container by the opener opening/closing mechanism 130, and the vertical axis represents the number of foreign particles (Number/WaferTimes) which have a grain size of 0.12 pm or more and which adhere to the uppermost wafer 300 stored in the container 200 per opening/closing of the container 200. FIG. 7 is a conceptual graph showing the correlation between the maximum velocity of opening and closing the container and the number of foreign particles adhering to a wafer when the inside pressure of the apparatus 400 is higher by 5 (Pa) than the pressure of the outside. The vertical and horizontal axes of FIG. 7 represent the same variables as those of FIG. 4. FIG. 8 shows a conceptual graph showing the correlation between the maximum velocity of opening and closing the container and the number of foreign particles adhered to a wafer when the inside pressure of the apparatus 400 is higher by 10 (Pa) than the pressure of the outside. The vertical and horizontal axes of FIG. 8 represent the same variables as those of FIGS. 4 and 7.

In FIG. 4, the number of foreign particles adhering to the wafer 300 exceeds 0.01 (Number/WaferTimes) at the maximum velocity of 0.06 (m/s), and it rapidly increases if the maximum velocity is over 0.06 (m/s). In FIG. 7, the number of foreign particles exceeds 0.01 (Number/WaferTimes) at the maximum velocity of 0.3 (m/s), and in FIG. 8, the number of foreign particles exceeds 0.01 (Number/WaferTimes) at the maximum velocity of 0.& (m/s). As is apparent from FIGS. 4, 7, and 8, it can be understood that the maximum velocity, at which the number of foreign particles increases, becomes higher in proportion to the differential pressure between the inside pressure and the outside pressure of the apparatus 400.

The number of foreign particles adhering to the wafer 300 can be reduced by decreasing the maximum velocity of opening of the container by the opener opening/closing mechanism 130. However, the slow operating velocity in each unit of the opening/closing apparatus 100 influences the process faculty of the manufacturing apparatus 400 per unit time. Therefore, it is required to set the operating velocity in an appropriate range. For this reason, it is conceived that the operating velocity should be set in a certain range capable of—sufficiently assuring the operation ability of the semiconductor manufacture, and also be set lower than the operating velocity at which the number of foreign particles is 0.01 (Number/WaferTimes), which is a boundary at which the number of foreign particles adhering to the wafer begins to rapidly increase in all of FIGS. 4, 7, and 8. Since the differential pressure between the inside pressure and the outside pressures of the apparatus 400 is proportional to the maximum velocity at which the number of foreign particles begins to increase, the number of foreign particles adhering to the wafer surface can be suppressed by setting a ratio (velocity-differential pressure ratio Dvp) between the Vmax: maximum velocity (m/s) of opening the container by the opener opening/closing mechanism 130 and APa: differential pressure (Pa) between the inside pressure of the apparatus 400 and the outside pressure so as to satisfy the formula I shown below:

$$V\mathrm{max}/APa = Dvp \sim 0.06,$$

where APa: differential pressure (Pa) between the inside pressure of the apparatus 400 and the outside pressure, Vmax: maximum velocity (m/s) of opening the container by the opener opening/closing mechanism 130, and Dvp: velocity-differential pressure ratio (m/sPa).

In this embodiment, since the velocity-differential pressure ratio is within the range defined by formula 1, the number of foreign particles adhering to the wafer 300 stored in the container 200 can be reduced. Therefore, the yield of the semiconductor component can be improved.

Note that this embodiment is an example where the condition outside the container is in the ISO cleanliness level 6, and the number of foreign particles adhering to the wafer changes depending on changes in the surrounding condition. However, the maximum velocity at which the number of foreign particles adhering to the wafer begins to rapidly increase is always constant.

By providing a packing at a contact position between a surface plate 150 of the opening/closing apparatus 100 and a flange 212 of the container 200, and by filling the gap between the surface plate 150 and the flange 212, the foreign particles which enter into the container at the time of opening the lid 220 of the container 200 are shut out. Thus, the number of foreign particles adhering to the wafer 300 can be reduced. If the packing is provided, however, the following problems are created. That is, one problem is that the packing itself generates dust due to the deterioration caused by the change with time and to repetitive use of the packing. Thus, there is an increase in the number of foreign particles adhering to the wafer. Another problem is that the cost is increased due to the additional cost required to provide the packing itself, to process the surface plate, and to install the packing. Since the packing is not required in this embodiment, the reliability is high and the cost is low.

Also, in another embodiment (second embodiment) of the present invention, an opening is provided at a lower end portion of the safety cover 140 of the opening/closing apparatus 100. In the conventional safety cover 140, the opening is provided at only the upper end portion of the safety cover. Therefore, a problem has arisen that the foreign particles generated from the opener opening/closing mechanism 130, the opener elevator mechanism 131, or the like are deposited inside the safety cover 140. As a result, the deposited foreign particles are blown out at the time when the opener elevator mechanism 131 moves downward, and enter the container 200 and adhere to the wafer. In this embodiment, since the opening is provided at the lower end portion of the safety cover 140, the foreign particles are not deposited inside the safety cover and are not blown out. Therefore, the number of foreign particles adhering to the wafer 300 stored in the container 200 can be reduced, and thus the yield of the semiconductor component can be improved.

The safety cover 140 covers the driving systems of the opener opening/closing mechanism 130 and the opener elevator mechanism 131 in order to ensure safety of an operator and to protect the driving systems at the time of conveying the opening/closing apparatus 100. Therefore, even if the opening is provided at the lower end portion of the safety cover 140, the safety cover does not lose its essential function.

Also, in this embodiment, the opening is simply provided at the lower end portion of the safety cover 140. However, the same effect can be expected by providing an exhaust fan at the lower end portion of the safety cover 140.

INDUSTRIAL APPLICABILITY

As described above, according to the present invention, it is possible to reduce the number of foreign particles entering into the container at the time of opening the container, and, therefore, the number of foreign particles adhering to the wafer can be reduced and the yield of the semiconductor component can be improved. In addition, since a packing is not required, an opening/closing apparatus having high reliability can be realized at low cost.

Also, according to the present invention, since the foreign particles are not deposited inside the safety cover, the foreign particles are not blown out, and, thus, the number of foreign particles adhering to the wafer can be reduced. Therefore, the yield of the semiconductor component can be improved.

What is claimed is:

1. A method of handling a semiconductor device, comprising the steps of:
   accommodating a semiconductor wafer in a semiconductor container and conveying the semiconductor container to a semiconductor manufacturing apparatus;
   connecting an opening of said semiconductor container and an opening of said semiconductor manufacturing apparatus;
   connecting said openings such that a velocity differential pressure ratio obtained by dividing the maximum velocity at the time of vertically opening a held lid of said semiconductor container, by the differential pressure between the inside pressure and the outside pressure of said semiconductor manufacturing apparatus, is set to be 0.06 ((m/s) Pa) or less; and
   processing a semiconductor wafer accommodated in said semiconductor container.

2. A method of opening and closing a semiconductor container, comprising the steps of:
   placing a semiconductor container accommodating a semiconductor wafer on a stage;
   connecting an opening of said semiconductor container and an opening of a semiconductor manufacturing apparatus;
   holding a lid of said semiconductor container and then opening and closing said lid in a direction vertical to an opening surface of the container with an opener; and
   moving down the opener holding the lid of said semiconductor container so as to connect the opening of said semiconductor container and the opening of said semiconductor manufacturing apparatus while both of the openings are opened, or moving up said opener so as to close the connection between said openings,
   wherein an operating velocity of opening the container by the opener is set such that a velocity-differential pressure ratio obtained by dividing the maximum velocity at the time of opening the lid of said semiconductor container, by the differential pressure between the inside pressure and the outside pressure of said semiconductor manufacturing apparatus, becomes 0.06 ((m/s) Pa) or less.

3. A method of opening and closing a semiconductor container, comprising the steps of:
   placing a semiconductor container accommodating a semiconductor wafer;
   connecting an opening of said semiconductor container and an opening of a semiconductor manufacturing apparatus;
   holding a lid of said semiconductor container and then opening and closing said lid in a direction vertical to an opening surface of the container with an opening means;
   moving down the opening means holding the lid of said semiconductor container so as to connect the opening of said semiconductor container and the opening of said semiconductor manufacturing apparatus while both of the openings are opened, or moving up said opening means so as to close the connection between said openings; and
   preventing foreign particles from being drawn into said semiconductor container during opening of said lid by setting an operating velocity of opening the container by the opening means is set such that a velocity-differential pressure ratio obtained by dividing the maximum velocity at the time of opening the lid of said semiconductor container, by the differential pressure between the inside pressure and the outside pressure of said semiconductor manufacturing apparatus, becomes 0.06 ((m/s) Pa) or less.

* * * * *